(12) United States Patent
Kronholz et al.

(10) Patent No.: US 8,541,281 B1
(45) Date of Patent: Sep. 24, 2013

(54) REPLACEMENT GATE PROCESS FLOW FOR HIGHLY SCALED SEMICONDUCTOR DEVICES

(75) Inventors: Stephan Kronholz, Dresden (DE); Ines Becker, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/588,059

(22) Filed: Aug. 17, 2012

(51) Int. Cl.
*H01L 21/8234* (2006.01)

(52) U.S. Cl.
USPC ............... 438/300; 438/682; 257/E21.621

(58) Field of Classification Search
USPC ............ 438/682, 300, 200; 257/E21.621
See application file for complete search history.

(56) References Cited

U.S. PATENT DOCUMENTS

| | | | |
|---|---|---|---|
| 6,521,956 B1 * | 2/2003 | Lee | 257/384 |
| 6,703,279 B2 * | 3/2004 | Lee | 438/300 |
| 7,465,664 B2 * | 12/2008 | Ho et al. | 438/682 |
| 8,071,442 B2 | 12/2011 | Kronholz et al. | |
| 8,124,467 B2 | 2/2012 | Kronholz et al. | |
| 2007/0090466 A1 * | 4/2007 | Park et al. | 257/382 |
| 2007/0155074 A1 * | 7/2007 | Ho et al. | 438/197 |
| 2010/0164014 A1 | 7/2010 | Kronholz et al. | |
| 2010/0164016 A1 | 7/2010 | Kronholz et al. | |
| 2010/0164020 A1 | 7/2010 | Kronholz et al. | |
| 2010/0289114 A1 | 11/2010 | Kronholz et al. | |

\* cited by examiner

*Primary Examiner* — Caridad Everhart
(74) *Attorney, Agent, or Firm* — Williams, Morgan & Amerson, P.C.

(57) ABSTRACT

A method disclosed herein includes forming sacrificial gate structures for a PFET and NFET transistor, removing the sacrificial gate structures and forming a replacement P-type gate structure for the PFET transistor and a replacement N-type gate structure for the NFET transistor, forming P-contact openings and N-contact openings in at least one layer of insulating material, wherein the P-contact openings expose portions of a P-active region and the N-contact openings expose portions of an N-active region, forming a masking layer that covers the exposed portions of the N-active region, performing an etching process though the P-contact openings in the layer of insulating material to define source/drain cavities in the P-active region proximate the replacement gate structure of the PFET transistor, and performing an epitaxial deposition process through the P-contact openings to form source/drain regions comprised of a semiconducting material in at least the source/drain cavities of the PFET transistor.

18 Claims, 8 Drawing Sheets

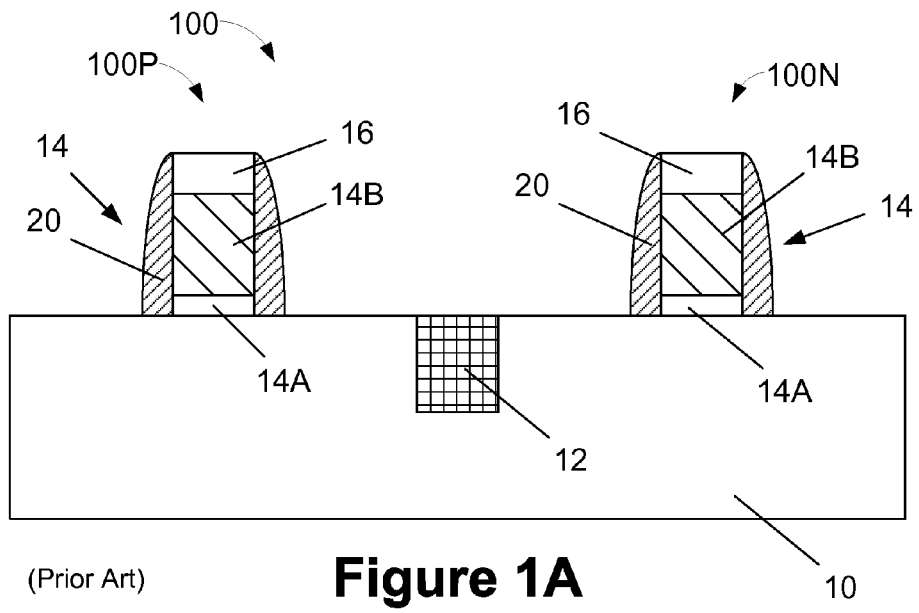
(Prior Art) Figure 1A
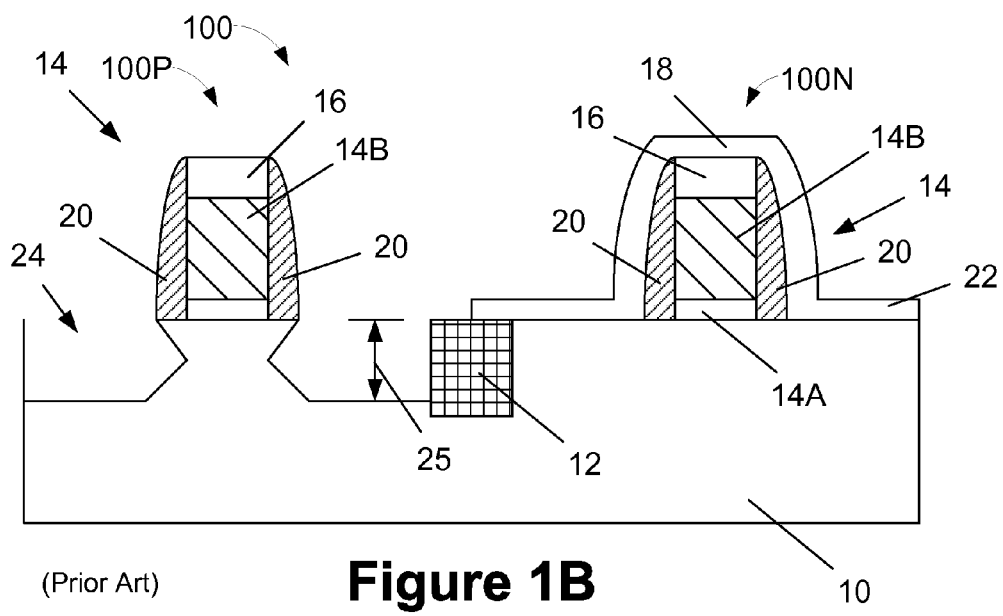
(Prior Art) Figure 1B

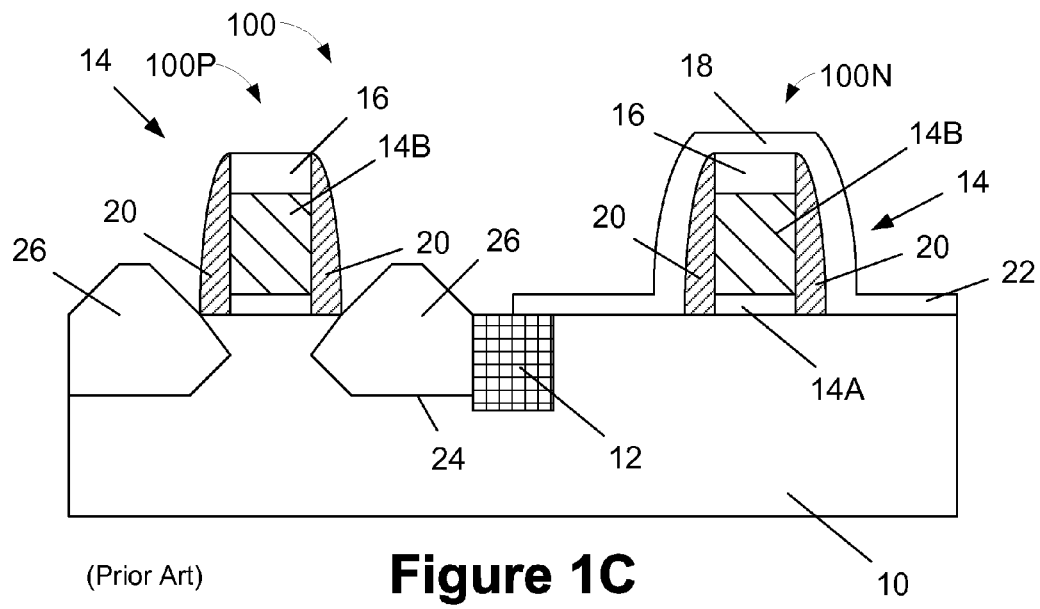
(Prior Art) Figure 1C
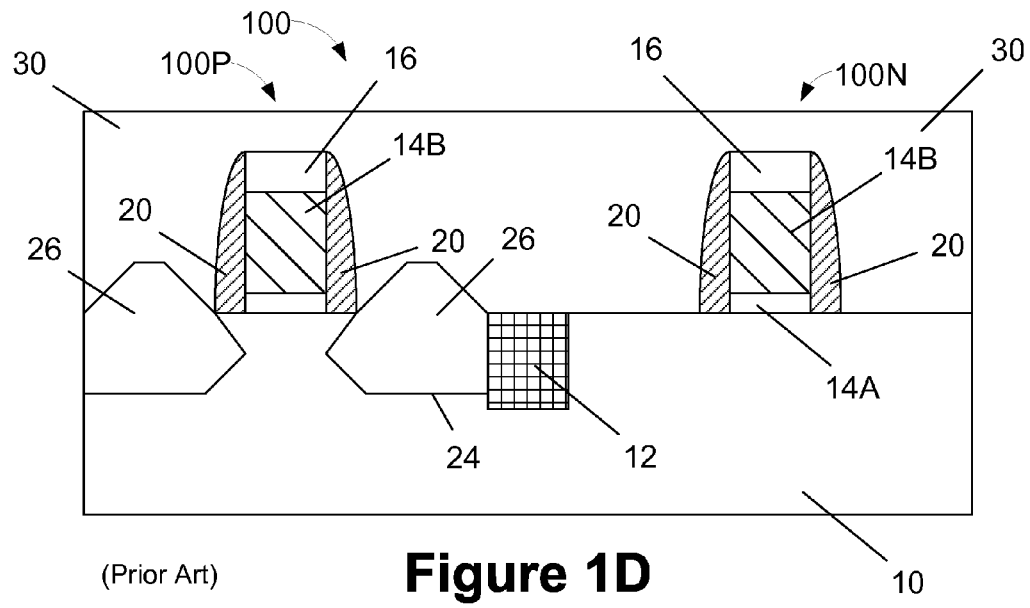
(Prior Art) Figure 1D

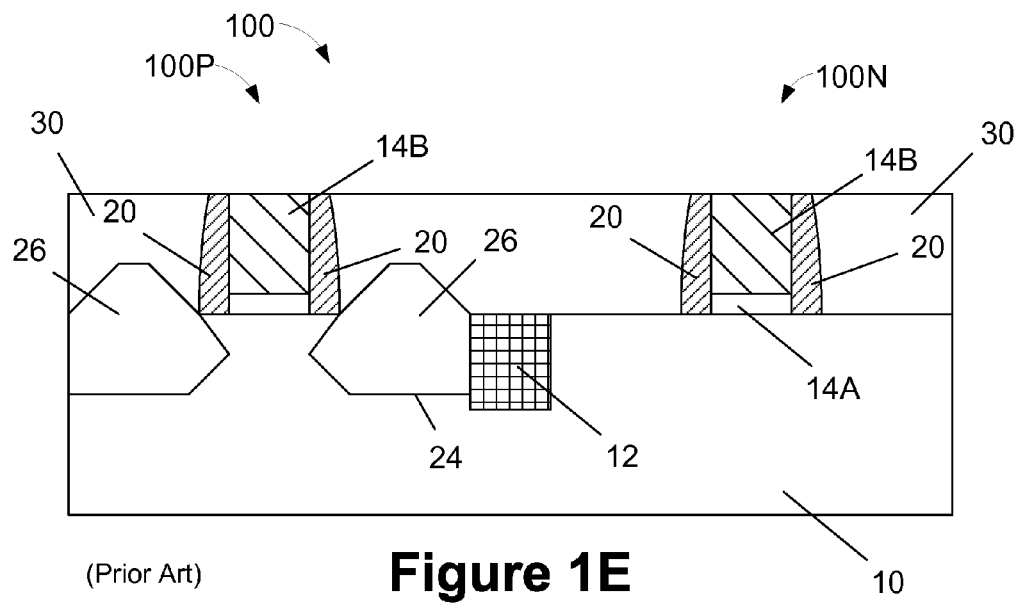
(Prior Art) Figure 1E
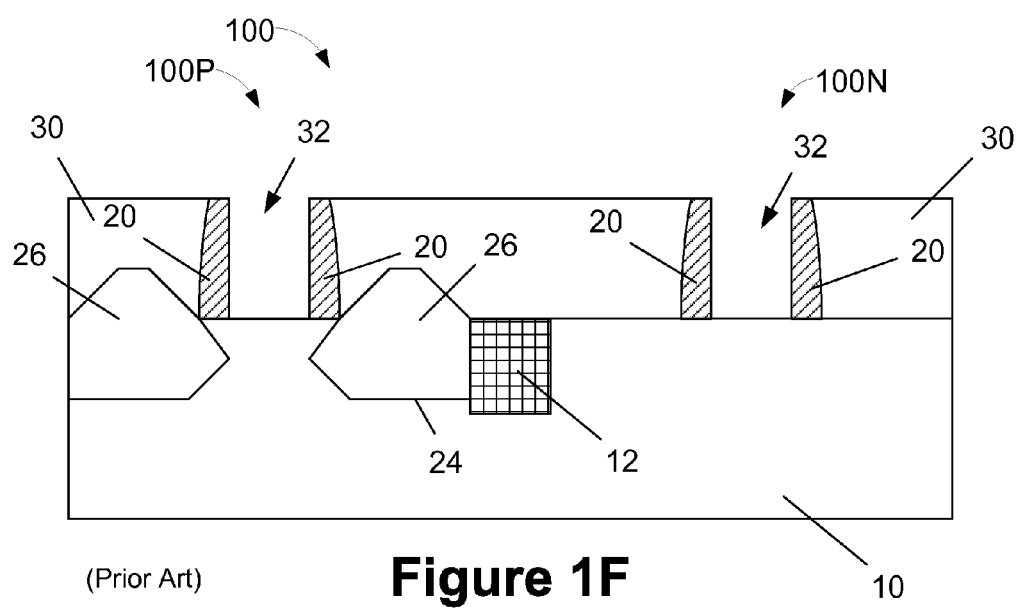
(Prior Art) Figure 1F

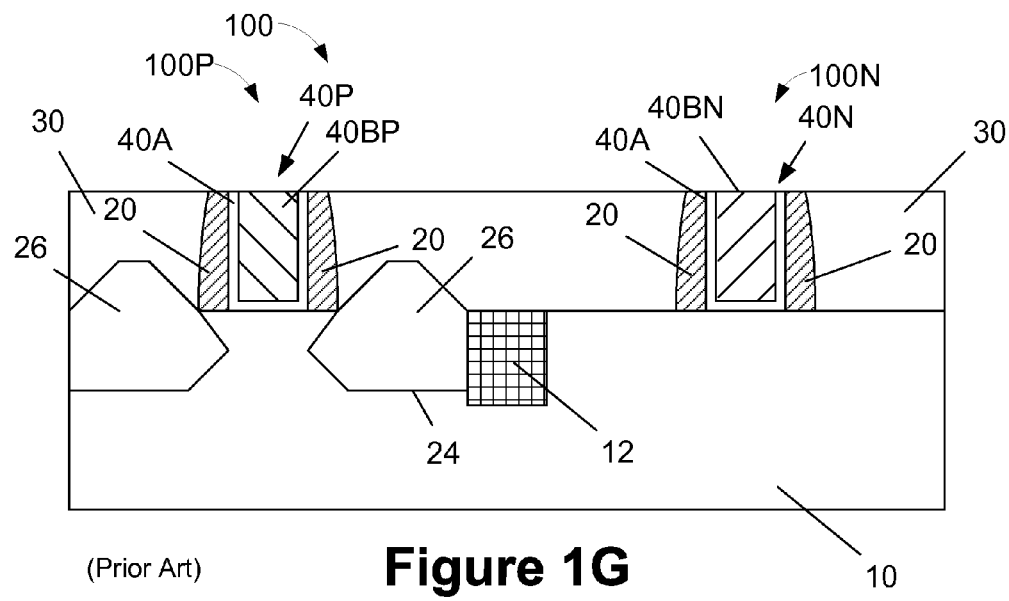
(Prior Art) Figure 1G
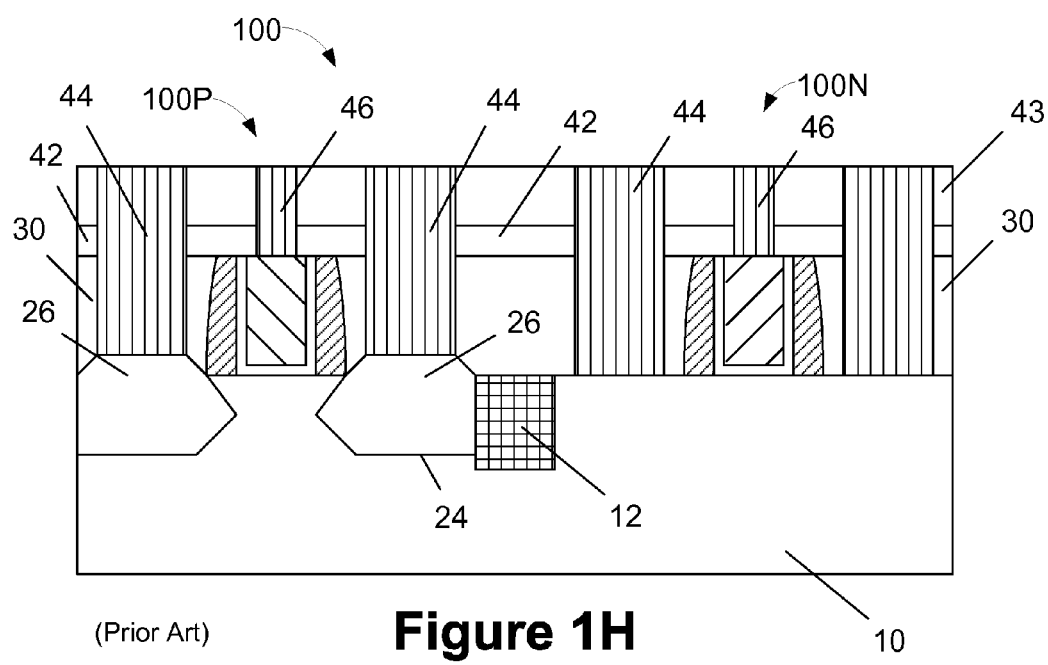
(Prior Art) Figure 1H

REPLACEMENT GATE PROCESS FLOW FOR HIGHLY SCALED SEMICONDUCTOR DEVICES

BACKGROUND OF THE INVENTION

1. Field of the Invention

Generally, the present disclosure relates to the manufacture of sophisticated semiconductor devices, and, more specifically, to a novel replacement gate process flow that may be employed in manufacturing highly scaled semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines performance of the integrated circuits. During the fabrication of complex integrated circuits using, for instance, MOS technology, millions of transistors, e.g., NFET transistors and/or PFET transistors, are formed on a substrate including a crystalline semiconductor layer. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Thus, in modern ultra-high density integrated circuits, device features, like the channel length, have been steadily decreasing in size to enhance the performance of the semiconductor device and the overall functionality of the circuit.

However, the ongoing shrinkage of feature sizes on transistor devices causes certain problems that may at least partially offset the advantages that may be obtained by reduction of the device features. Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NFET transistors and create a compressive stress in the channel region for PFET transistors). Stress engineering techniques typically involve the formation of specifically made silicon nitride layers that are selectively formed above appropriate transistors, i.e., a layer of silicon nitride that is intended to impart a tensile stress in the channel region of an NFET transistor would only be formed above the NFET transistors. Such selective formation may be accomplished by masking the PFET transistors and then blanket depositing the layer of silicon nitride, or by initially blanket depositing the layer of silicon nitride across the entire substrate and then performing an etching process to selectively remove the silicon nitride from above the PFET transistors. Conversely, for PFET transistors, a layer of silicon nitride that is intended to impart a compressive stress in the channel region of a PFET transistor is formed above the PFET transistors. The techniques employed in forming such nitride layers with the desired tensile or compressive stress are well known to those skilled in the art.

For many early device technology generations, the gate electrode structures of most transistor elements has comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. FIGS. 1A-1H depict one illustrative prior art process flow for forming a semiconductor device 100 that includes an illustrative PFET transistor 100P and an illustrative NFET transistor 100N using a replacement gate technique. FIG. 1A schematically depicts the device 100 after several process operations have been performed. Initially, illustrative shallow trench isolation structures 12 are formed in the substrate 10. Thereafter, "dummy" gate structures 14 will be formed for the PFET transistor 100P and the NFET transistor 100N in and above regions of the substrate 10 that are separated by the illustrative shallow trench isolation structure 12. The dummy gate structures 14 generally include a gate insulation layer 14A and a gate electrode layer 14B. A gate cap layer 16, made of a material such as silicon nitride, is formed above the gate structures 14. The gate insulation layer 14A may be comprised of a variety of materials, such as silicon dioxide. The gate electrode layer 14B may be comprised of one or more layers of conductive materials, such as polysilicon, etc. The structure depicted in FIG. 1A may be formed by performing a variety of known techniques. For example, the layers of material that make up the gate insulation layer 14A, the gate electrode layer 14B and the gate cap layer 16 may be blanket deposited above the substrate 10 and, thereafter, one or more etching processes are performed through a patterned mask layer (not shown) to define the dummy gate structures 14 depicted in FIG. 1A. At this point, if desired, one or more implantation processes may be performed to form extension implant regions and/or so-called halo implant regions for one or both of the PFET transistor 100P and the NFET transistor 100N by performing known ion implantation and masking operations. However, such implant regions are not depicted in the attached drawings. With continuing reference to FIG. 1A, illustrative silicon nitride sidewall spacers 20 with an illustrative base width of about 5-10 nm are formed adjacent dummy gate structures 14 for both the PFET transistor 100P and the NFET transistor 100N. The spacers 20 may be formed by depositing a layer of spacer material and thereafter performing an anisotropic etching process. One or more of the various ion implant processes mentioned above may be formed after the formation of the spacers 20.

FIG. 1B depicts the device 100 after several process operations have been performed. More specifically, a hard mask layer 22, made of a material such as silicon nitride, is formed above the NFET transistor 100N. The hard mask layer 22 may be formed by blanket depositing the hard mask layer 22 across the device 100 and, thereafter, forming a masking layer (not shown), e.g., such as a photoresist mask, so as to cover the NFET transistor 100N and expose the PFET transistor 100P for further processing. Then, an etching process is performed to remove the hard mask layer 22 from above the PFET transistor 100P. Next, one or more etching processes are performed to define cavities 24 in areas of the substrate 10 where source/drain regions for the PFET transistor 100P will ultimately be formed. In some cases, the spacers 20 may be removed prior to the formation of the cavities 24. The depth and shape of the cavities 24 may vary depending upon the particular application. In one example, where the cavities 24 have an overall depth 25 of about 70 nm, the cavities 24 may be formed by performing an initial dry anisotropic etching process to a depth of about 40-50 nm and, thereafter, performing a wet etching process using, for example, TMAH, which has an etch rate that varies based upon the crystalline structure of the substrate 10, e.g., the etching process using TMAH exhibits a higher etch rate in the <110> direction than it does in the <100> direction.

FIG. 1C depicts the device 100 after an epitaxial deposition process is performed to form epitaxial silicon/germanium regions 26 in the cavities 24. In the depicted example, the regions 26 have an overfill portion that extends above the surface of the substrate 10 by, for example, a distance of about 25 nm. The epitaxial silicon/germanium regions 26 may be formed by performing well-known epitaxial deposition processes, and a P-type dopant material may be introduced into the epitaxial silicon/germanium regions 26 as they are being formed, i.e., an in situ doping process.

As shown in FIG. 1D, after the epitaxial silicon/germanium regions 26 are formed, the PFET transistor 100P may be covered by a photoresist mask (not shown) and an etching process using, for example, hot phosphoric acid, may be performed to remove the hard mask layer 22 from above the NFET transistor 100N. At this point, a source/drain ion implant process using an N-type dopant may be performed to form source/drain regions (not shown) on the NFET transistor 100N. Then, a layer of insulating material 30 such as, for example, silicon dioxide, is blanket deposited across the device 100.

Next, as shown in FIG. 1E, one or more chemical mechanical polishing (CMP) processes have been performed to remove any materials above the sacrificial gate electrode 14B so that the sacrificial gate structure 14 may be removed.

Then, as shown in FIG. 1F, one or more etching processes are performed to remove the sacrificial gate electrode 14B and the sacrificial gate insulation layer 14A to thereby define a gate cavity 32 where a replacement gate structure will subsequently be formed. A masking layer that is typically used in such etching processes is not depicted for purposes of clarity. Typically, the sacrificial gate insulation layer 14A is removed as part of the replacement gate technique, as depicted herein. However, the sacrificial gate insulation layer 14A may not be removed in all applications.

Next, as shown in FIG. 1G, various layers of material that will constitute a replacement gate structure 40P for the PFET transistor 100P and a replacement gate structure 40N for the NFET transistor are formed in the gate cavities 32 (FIG. 1F). Typically, the gate insulation layer 40A for the replacement gate structures for both the PFET and NFET transistors will be the same, e.g., a high-k (k value greater than about 10) gate insulation layer 40A, such as hafnium oxide, having a thickness of approximately 2 nm. The gate electrodes 40BP, 40BN of the replacement gate structures 40P, 40N, respectively, will typically be comprised of multiple layers of conductive material, e.g., one or more metal layers, and the number of materials and the type of materials used for the gate electrode 40BP in the replacement gate structure 40P for the PFET transistor 100P may be different than the materials used for the gate electrode 40BN in the replacement gate structure 40N for the NFET transistor 100N. In some cases, the use of additional materials for the gate electrode 40BP for the PFET transistor 100P results in the PFET transistor 100P having a taller gate structure than that of the NFET transistor 100N. However, such a height differential is not depicted in the attached drawings. The materials that are used to form the gate structures 40P, 40N are typically conformably deposited in the gate cavities 32 and above the layer of insulating material 30. To the extent that different materials are used on the different devices 100P, 100N, appropriate masking layers (not shown) may be formed to allow for the formation of the desired materials on the appropriate device. Ultimately, after all of the materials are formed for the replacement gate structures 40P, 40N, one or more CMP processes are performed to remove excess portions of the material of the gate insulation layer 40A and the various conductive materials that make up the gate electrodes 40BP, 40BN of the gate structures 40P, 40N, respectively, that are positioned outside of the gate cavity to define the replacement gate structures 40P, 40N. Although not depicted in the drawings, at this point in the fabrication process, if desired, stress-inducing material layers (compressive for the PFET transistor 100P and tensile for the NFET transistor 100N) may be formed on the various devices to increase the electrical performance characteristics of the transistors.

Next, as shown in FIG. 1H, a protective cap layer 42, e.g., a layer of silicon nitride, is formed so as to protect the replacement gate structures 40P, 40N, and a layer of insulating material 43, e.g., silicon dioxide, is formed above the protective cap layer 42. Thereafter, using traditional processing techniques, contact openings are formed through the layers of insulating material 30, 43 and the protective cap layer 42 to expose the underlying source/drain regions of the transistor devices 100P, 100N. Metal silicide regions (not shown) are then formed on the exposed portions of the source/drain regions. Thereafter, conductive source drain contacts 44 and conductive gate contacts 46, e.g., titanium nitride contacts, are formed in the openings in the layers of insulating material 30, 43 and the protective cap layer 42 using traditional contact formation techniques and materials. Ultimately, several metallization layers (not shown) will be formed above the device 100 to complete its fabrication.

The present disclosure is directed to a novel replacement gate process flow that may be employed in manufacturing highly scaled semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a novel replacement gate process flow that may be employed in manufacturing highly scaled semiconductor devices. In one example, a method disclosed herein includes forming sacrificial gate structures for both a PFET transistor and an NFET transistor, removing the sacrificial gate structures and forming a replacement P-type gate structure for the PFET transistor and a replacement N-type gate structure for the NFET transistor, after forming the replacement gate structures, forming a plurality of P-contact openings and a plurality of N-contact openings in at least one layer of insulating material, wherein the P-contact openings expose portions of a P-active region and the N-contact openings expose portions of an N-active region, forming a masking layer that covers the exposed portions of the N-active region, with the masking layer in place, performing at least one etching process though the P-contact openings in the at least one layer of insulating material to define a plurality of source/drain cavities in the P-active region proximate the replacement gate structure of the PFET transistor, and performing at least one epitaxial deposition process through the P-contact openings to form source/drain regions comprised of a semiconducting material in at least the source/drain cavities of the PFET transistor.

BRIEF DESCRIPTION OF THE DRAWINGS

The disclosure may be understood by reference to the following description taken in conjunction with the accompanying drawings, in which like reference numerals identify like elements, and in which:

FIGS. 1A-1H depict one illustrative prior art process flow for forming a semiconductor device using a replacement gate technique.

Figure 2A:
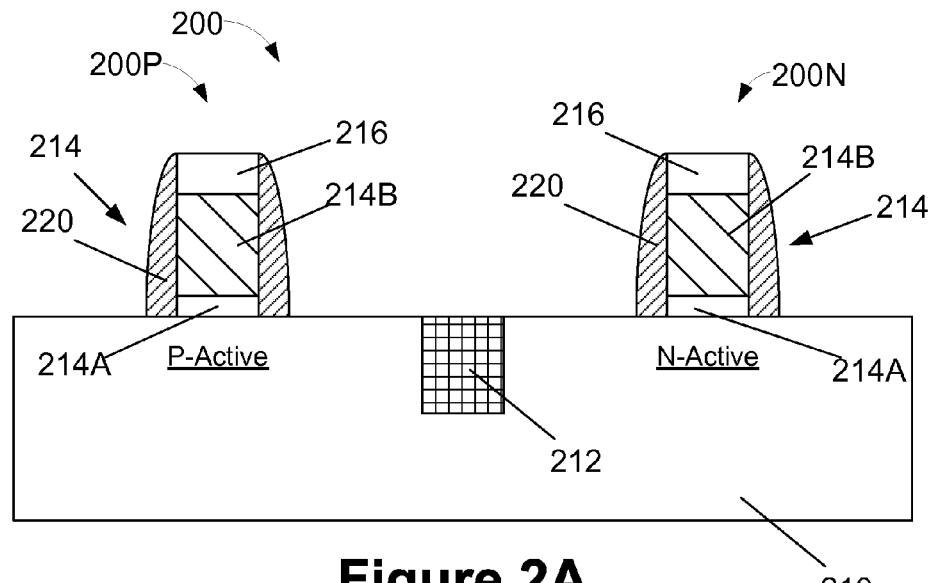
FIGS. 2A-2G depict various illustrative examples of a novel replacement gate process flow that may be employed in manufacturing highly scaled semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a novel replacement gate process flow that may be employed in manufacturing highly scaled semiconductor devices. As will be readily apparent to those skilled in the art upon a complete reading of the present application, the methods disclosed herein may be employed in forming a variety of different devices including, but not limited to, logic devices, memory devices, etc. With reference to the attached drawings, various illustrative embodiments of the various methods disclosed herein will now be described in more detail.

FIG. 2A is a simplified view of an illustrative semiconductor device 200 at an early stage of manufacturing that is formed above a semiconducting substrate 210. FIGS. 2A-2H depict one illustrative process flow for forming a semiconductor device 200 that includes an illustrative PFET transistor 200P and an illustrative NFET transistor 200N using a replacement gate technique. FIG. 2A schematically depicts the device 200 after several process operations have been performed. Initially, illustrative shallow trench isolation structures 212 are formed in the substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein the transistors 200P and 200N are formed in and above the active layer. Thus, the terms "substrate" or "semiconducting substrate" should be understood to cover all forms of semiconductor structures made of any semiconducting material.

With continuing reference to FIG. 2A, sacrificial or "dummy" gate structures 214 are formed for a PFET transistor 200P and an NFET transistor 200N formed above P-active and N-active regions, respectively, defined in the substrate 210. The dummy gate structures 214 generally include a sacrificial gate insulation layer 214A and a sacrificial gate electrode layer 214B. A gate cap layer 216, made of a material such as silicon nitride, is formed above the gate structures 214. As will be recognized by those skilled in the art after a complete reading of the present application, the gate structures 214 may be of any desired construction and comprised of any of a variety of different materials. In one illustrative embodiment, the gate insulation layer 214A may be comprised of silicon dioxide and the gate electrode 214B may be comprised of polysilicon. The gate structures 214 depicted in FIG. 2A may be formed by a performing a variety of known techniques. For example, the layers of material that make up the gate insulation layer 214A, the gate electrode layer 214B and the gate cap layer 216 may be blanket deposited above the substrate 210 and, thereafter, one or more etching process are performed through a patterned mask layer (not shown) to define the dummy gate structures 214 depicted in FIG. 2A, with the cap layer 216 positioned thereabove. At this point, if desired, one or more implantation processes may be performed to form extension implant regions and/or so-called halo implant regions for one or both of the PFET transistor 200P and the NFET transistor 200N by performing known ion implantation and masking operations. After all extension implant regions are formed, illustrative silicon nitride sidewall spacers 220 are formed adjacent dummy gate structures 214 for both the PFET transistor 200P and the NFET transistor 200N. The spacers 220 may be formed by depositing a layer of spacer material and thereafter performing an anisotropic etching process. After the formation of the spacers 220, the PFET transistor 200P may be masked and a source/drain implantation process may be performed on the NFET transistor 200N to form deep source/drain implant regions (not shown) in the N-active region that are self-aligned with respect to the sidewall spacers 220 on the NFET transistor 200N.

Figure 2B:
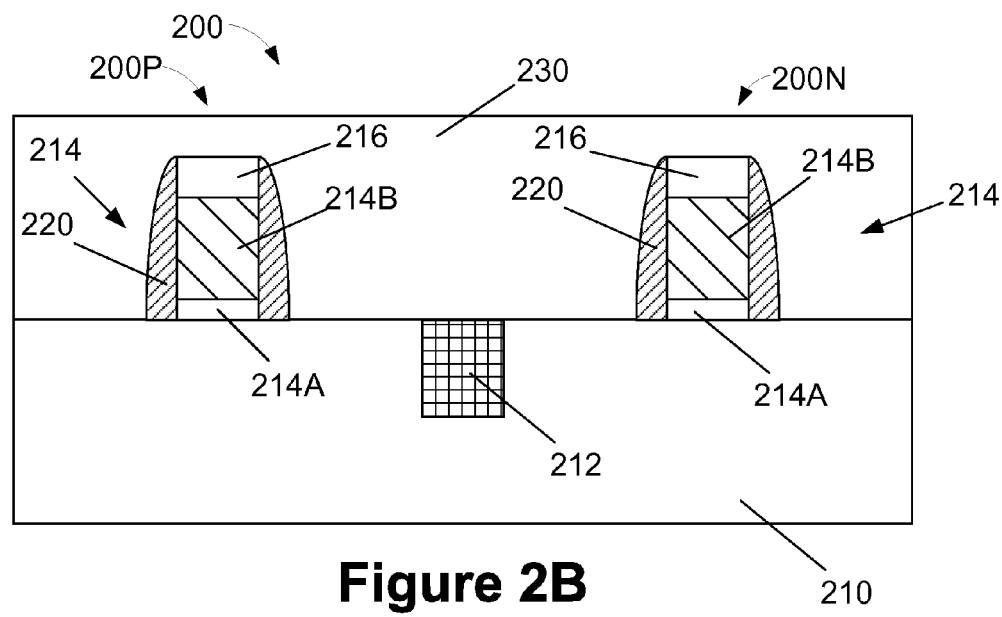
Figure 2C:
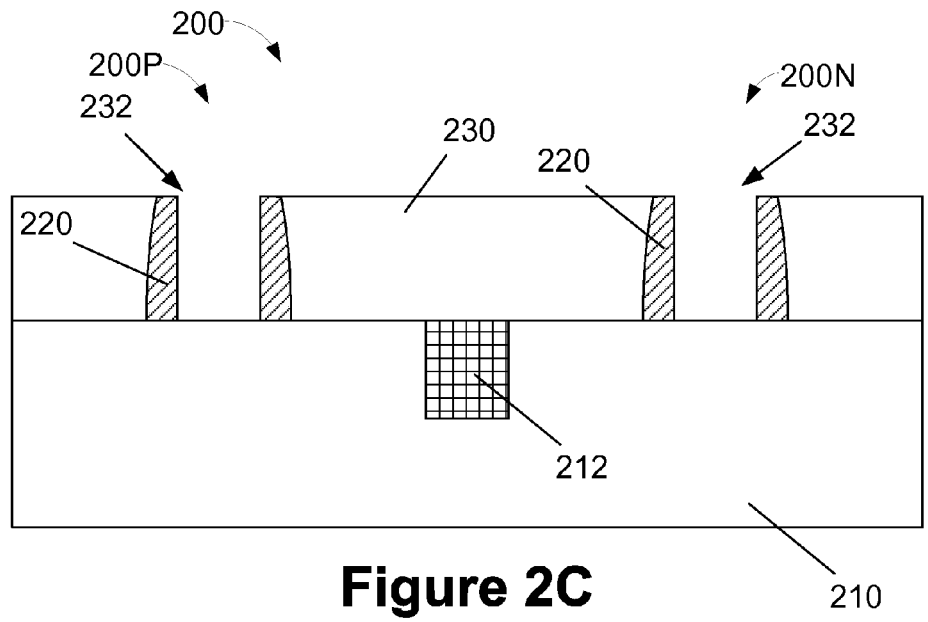

With reference to FIGS. 2B-2C, the next process operation in the novel process flow described herein involves removing the sacrificial gate structures 214. Initially, as shown in FIG. 2B, a layer of insulating material 230 such as, for example, silicon dioxide is blanket deposited across the device 200. Then, as shown in FIG. 2C, one or more chemical mechanical polishing (CMP) processes have been performed to remove any materials above the sacrificial gate electrode 214B so that the sacrificial gate structures 214 may be removed. Next, one or more etching processes are performed to remove the sacrificial gate electrode 214B and the sacrificial gate insulation layer 214A to thereby define a plurality of gate cavities 232 where a replacement gate structure will subsequently be formed. A masking layer that is typically used in such etching processes is not depicted for purposes of clarity. Typically, the sacrificial gate insulation layer 214A is removed as part of the replacement gate technique, as depicted herein. However, the sacrificial gate insulation layer 214A may not be removed in all applications.

Figure 2D:
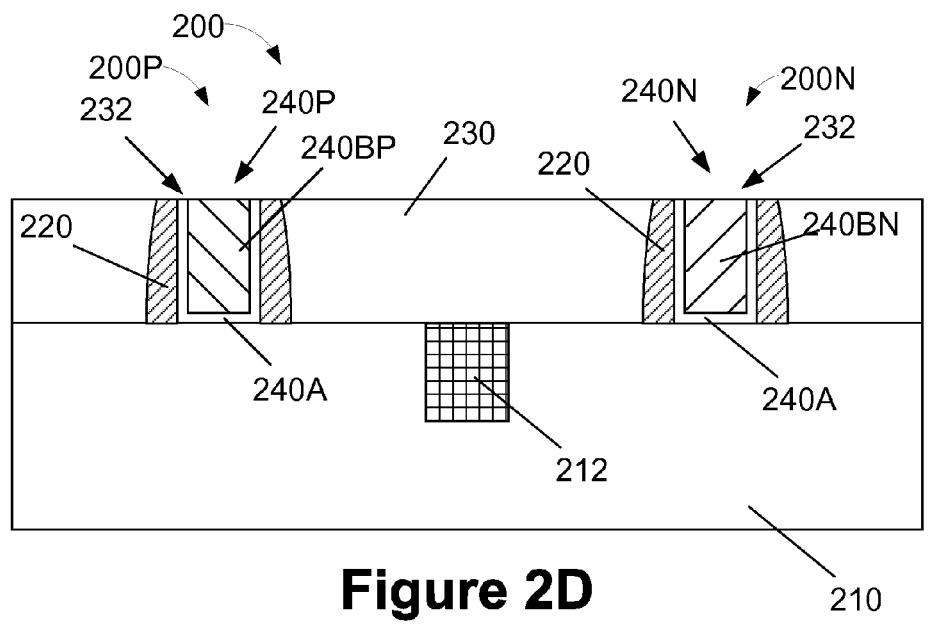

Next, as shown in FIG. 2D, various layers of material that will constitute a replacement gate structure 240P for the PFET transistor 200P and a replacement gate structure 240N for the NFET transistor 200P are formed in the gate cavities 232. Typically, the gate insulation layer 240A for the replacement gate structures for both the PFET and NFET transistors will be the same, e.g., a high-k (k value greater than about 10) gate insulation layer 240A, such as hafnium oxide, having a thickness of approximately 2 nm. The gate electrodes 240BP, 240BN of the replacement gate structures 240P, 240N, respectively, will typically be comprised of multiple layers of conductive material, e.g., one or more metal layers. However, the number of layers of material and the type of materials used for the gate electrode 240BP in the replacement gate structure 240P for the PFET transistor 200P may be different than the materials used for the gate electrode 240BN in the replacement gate structure 240N for the NFET transistor 200N. In some cases, the use of additional materials for the gate electrode 240BP for the PFET transistor 200P results in the PFET transistor 200P having a taller gate structure than that of the NFET transistor 200N. However, such a height differential is not depicted in the attached drawings. The materials that are used to form the gate structures 240P, 240N are typically conformably deposited in the gate cavities 232 and above the layer of insulating material 230. To the extent that different materials are used on the different devices 200P, 200N, appropriate masking layers (not shown) may be formed to allow for the formation of the desired materials on the appropriate device. Ultimately, after all of the materials are formed for the replacement gate structures 240P, 240N, one or more CMP processes are performed to remove excess portions of the material of the gate insulation layer 240A and the various conductive materials that make up the gate electrodes 240BP, 240BN of the gate structures 240P, 240N, respectively, that are positioned outside of the gate cavities 232 to thereby define the schematically depicted replacement gate structures 240P, 240N.

Figure 2E:
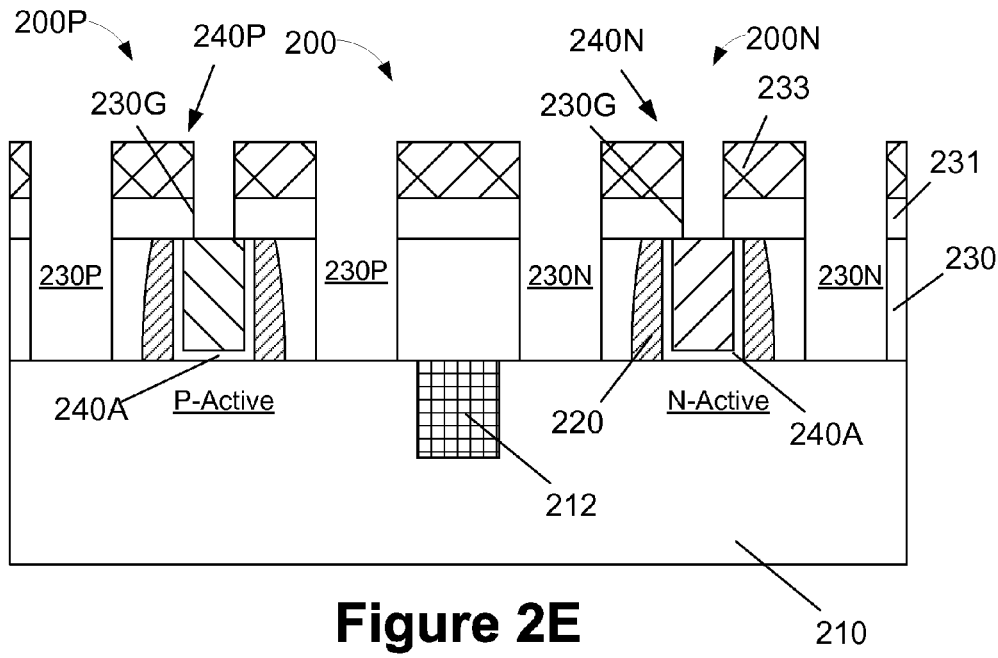

FIG. 2E depicts the device 200 after several process operations have been performed. Initially, a second layer of insulating material 231, e.g., silicon dioxide, is deposited above the first layer of insulating material 230. Alternatively, if desired, the first layer of insulating material 230 may be removed and a single layer of insulating material (not shown) may be deposited above the device and planarized or etched-back to the final desired thickness. In the depicted example, the layers 230, 231 constitute the insulating materials where conductive contact structures will be formed to contact the source/drain regions and gate electrode of the transistors 200P, 200N. Next, a patterned etch mask 233, e.g., a patterned photoresist mask, is formed above the layer of insulating material 231 using traditional photolithography tools and techniques. Then, an etching process is performed through the patterned etch mask 233 to define a plurality of P-contact openings 230P and a plurality of N-contact openings 230N in the layers of insulating material 231, 230 that, as shown, expose portions of the P-active region adjacent the PFET transistor 200P and the N-active region adjacent the NFET transistor 200N, respectively. If desired, gate contact openings 230G for the gate contacts may also be formed at this time. The P-contact openings 230P and the N-contact openings 230N will eventually be filled with conductive structures that contact the source/drain regions of the PFET transistor and NFET transistor, respectively. At the point of fabrication depicted in FIG. 2E, the source/drain regions (not shown) have already been formed in the N-active region for the NFET transistor 200N.

Figure 2F:
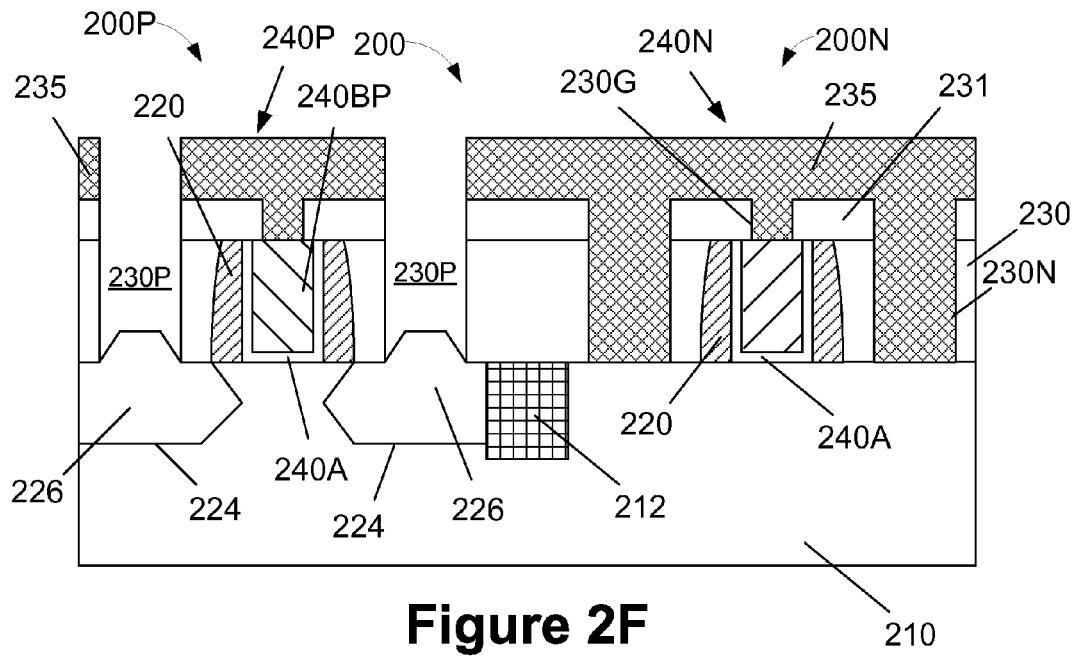

FIG. 2F depicts the device 200 after several process operations have been performed. First, the etch mask 233 has been removed and a second etch mask 235, e.g., a silicon nitride or silicon oxynitride mask, has been formed to cover the NFET transistor 200N in general and, more particularly, to cover the exposed portions of the N-active region exposed by the N-contact openings 230N, while leaving at least the exposed portions of the P-active region exposed by contact openings 230P exposed for further processing. Thereafter, with the NFET transistor masked, i.e., with the second mask layer 235 in position, one or more etching processes are performed through the P-contact openings 230P in the patterned layers of insulating material 231, 230 to define the illustrative cavities 224 in the P-active region where source/drain regions for the PFET transistor 200P will ultimately be formed. The depth and shape of the cavities 224 may vary depending upon the particular application. In one example, where the cavities 224 have an overall depth of about 70 nm, the cavities 224 may be formed by performing an initial dry anisotropic etching process to a depth of about 40-50 nm and, thereafter, performing a wet etching process using, for example, TMAH, which has an etch rate that varies based upon the crystalline structure of the substrate 210, e.g., the etching process using TMAH exhibits a higher etch rate in the <110> crystalline direction than it does in the <100> crystalline direction. Note that the etching processes that are performed to form the cavities 224 are performed through the P-contact openings 230P in the patterned layers of insulating material 230, 231 while the etch mask 235 serves to protect the portions of the N-active region exposed by the openings 230N during the cavity etching processes.

With continuing reference to FIG. 2F, with the patterned layers of insulating material 231, 230, and the mask layer 235 still in position, an epitaxial deposition process is performed through the P-contact openings 230P to form epitaxial silicon/germanium regions 226 in the cavities 224. In the depicted example, the regions 226 have an overfill portion that extends above the surface of the substrate 210 by, for example, a distance of about 25 nm. The epitaxial silicon/germanium regions 226 may be formed by performing well-known epitaxial deposition processes and a P-type dopant material may be introduced into the epitaxial silicon/germanium regions 226 as they are being formed, i.e., an in situ doping process.

Although not depicted in the drawings, at this point in the fabrication process, if desired, the second mask 235 may be removed and traditional processing operations may be performed through the openings 230P, 230N to form metal silicide regions (not shown) on the exposed portions of the underlying substrate 210, i.e., on the source/drain regions for the transistors 200P, 200N and on exposed portions of the gate electrodes (through the gate contact openings 230G).

Figure 2G:
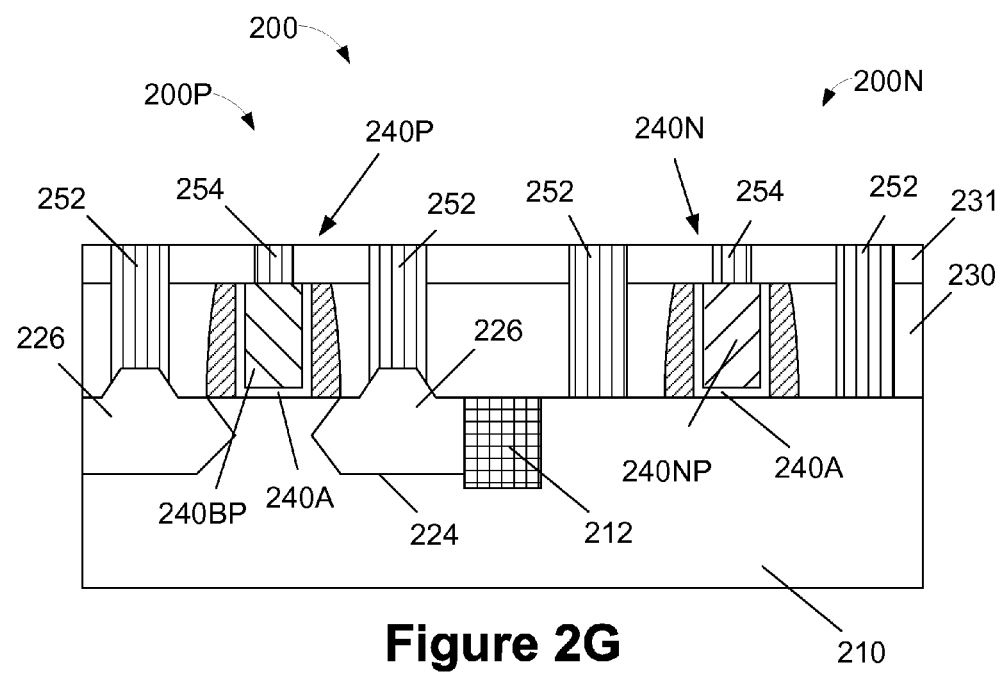

Next, as shown in FIG. 2G, conductive source drain contacts 252 and conductive gate contacts 254, e.g., titanium nitride contacts, are formed in the openings in the layers of insulating material 231, 230 using traditional contact formation techniques and materials. Ultimately, several metallization layers (not shown) will be formed above the device 200 to complete its fabrication.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming sacrificial gate structures for both a PFET transistor and an NFET transistor above a semiconducting substrate, said sacrificial gate structures for said PFET transistor and said NFET transistor being formed above a P-active region and an N-active region, respectively, of said substrate;
   removing said sacrificial gate structures and forming a replacement P-type gate structure for said PFET transistor and a replacement N-type gate structure for said NFET transistor;
   after forming said replacement P-type and N-type gate structures, forming a plurality of P-contact openings and a plurality of N-contact openings in at least one layer of insulating material, wherein said P-contact openings expose portions of said P-active region and said N-contact openings expose portions of said N-active region;
   forming a masking layer that covers said exposed portions of said N-active region;
   with said masking layer in place, performing at least one etching process though said P-contact openings in said at least one layer of insulating material to define a plurality of source/drain cavities in said P-active region proximate said P-type replacement gate structure of said PFET transistor; and
   performing at least one epitaxial deposition process through said P-contact openings to form source/drain regions comprised of a semiconducting material in at least said source/drain cavities of said PFET transistor.

2. The method of claim 1, wherein said masking layer is comprised of silicon nitride or silicon oxynitride.

3. The method of claim 1, wherein performing at least one epitaxial deposition process to form source/drain regions comprised of a semiconducting material in said source/drain cavities of said PFET transistor comprises performing an in situ doping epitaxial deposition process to form raised P-doped silicon/germanium source/drain regions in said source/drain cavities of said PFET transistor.

4. The method of claim 1, wherein said replacement gate structures of said PFET transistor and said NFET transistor are comprised of the same materials.

5. The method of claim 1, wherein said replacement gate structures of said PFET transistor and said NFET transistor are comprised of different materials.

6. The method of claim 1, wherein said replacement gate structures of said PFET transistor and said NFET transistor are each comprised of a high-k gate insulation layer and at least one layer of metal formed above said high-k gate insulation layer.

7. The method of claim 1, wherein said masking layer covers said exposed portions of said N-active region while said epitaxial deposition process is performed.

8. The method of claim 1, further comprising, prior to removing said sacrificial gate structures of said NFET and PFET transistors, performing at least one ion implant process to form an implant region comprised of an N-type dopant material in said N-active region proximate said sacrificial gate structure of said NFET transistor.

9. The method of claim 8, further comprising, prior to removing said sacrificial gate structures of said NFET and PFET transistors, performing at least one ion implant process to form an implant region comprised of a P-type dopant material in said P-active region proximate said sacrificial gate structure of said PFET transistor.

10. A method, comprising:
    forming sacrificial gate structures for both a PFET transistor and an NFET transistor above a P-active region and an N-active region, respectively, of a semiconducting substrate;
    forming at least one sidewall spacer proximate each of said sacrificial gate structures of each of said PFET and NFET transistors;
    forming a first layer of insulating material adjacent said sidewall spacer for each of said PFET and NFET transistors;
    removing said sacrificial gate structures of said PFET transistor and said NFET transistor to thereby define a gate cavity for each of said PFET transistor and said NFET transistor;
    forming a replacement P-type gate structure in said gate cavity of said PFET transistor and a replacement N-type gate structure in said gate cavity of said NFET transistor;
    after forming said replacement P-type and N-type gate structures for both of said PFET and NFET transistors, respectively, forming a second layer of insulating material above said first layer of insulating material;
    after forming said replacement P-type and N-type gate structures, forming a plurality of P-contact openings and a plurality of N-contact openings in said first and second layers of insulating material, wherein said P-contact openings expose portions of said P-active region and said N-contact openings expose portions of said N-active region;

forming a masking layer that covers said exposed portions of said N-active region;

with said masking layer in place, performing at least one etching process though said P-contact openings in said first and second layers of insulating material to define a plurality of source/drain cavities in said P-active region proximate said P-type replacement gate structure of said PFET transistor; and with said masking layer in place, performing at least one epitaxial deposition process through said P-contact openings to form source/drain regions comprised of a semiconducting material in at least said source/drain cavities of said PFET transistor.

11. The method of claim 10, wherein performing at least one epitaxial deposition process to form source/drain regions comprised of a semiconducting material in said source/drain cavities of said PFET transistor comprises performing an in situ doping epitaxial deposition process to form raised P-doped silicon/germanium source/drain regions in said source/drain cavities of said PFET transistor.

12. The method of claim 10, wherein said replacement gate structures of said PFET transistor and said NFET transistor are comprised of the same materials.

13. The method of claim 10, wherein said replacement gate structures of said PFET transistor and said NFET transistor are comprised of different materials.

14. The method of claim 10, wherein said replacement gate structures of said PFET transistor and said NFET transistor are each comprised of a high-k gate insulation layer and at least one layer of metal formed above said high-k gate insulation layer.

15. The method of claim 10, wherein said masking layer covers said exposed portions of said N-active region while said epitaxial deposition process is performed.

16. The method of claim 10, wherein said masking layer is comprised of silicon nitride or silicon oxynitride.

17. The method of claim 10, further comprising, prior to removing said sacrificial gate structures of said NFET and PFET transistors, performing at least one ion implant process to form an implant region comprised of an N-type dopant material in said N-active region proximate said sacrificial gate structure of said NFET transistor.

18. The method of claim 17, further comprising, prior to removing said sacrificial gate structures of said NFET and PFET transistors, performing at least one ion implant process to form an implant region comprised of a P-type dopant material in said P-active region proximate said sacrificial gate structure of said PFET transistor.

* * * * *